United States Patent [19]

Hollmer et al.

[11] Patent Number: 5,828,601
[45] Date of Patent: Oct. 27, 1998

[54] PROGRAMMED REFERENCE

[75] Inventors: Shane C. Hollmer; Lee E. Cleveland, both of Santa Clara, Calif.

[73] Assignee: Advanced Micro Devices, Inc., Sunnyvale, Calif.

[21] Appl. No.: 160,582

[22] Filed: Dec. 1, 1993

[51] Int. Cl.$^6$ .................................................. G11C 11/34
[52] U.S. Cl. ............................... 365/185.2; 365/185.22; 365/185.24; 365/210
[58] Field of Search .................................... 365/168, 184, 365/185, 210, 185.2, 185.24, 185.22

[56] References Cited

U.S. PATENT DOCUMENTS

| | | | |
|---|---|---|---|
| 4,449,203 | 5/1984 | Adlhoch | 365/104 |
| 4,495,602 | 1/1985 | Sheppard | 365/104 |
| 4,811,291 | 3/1989 | de Ferron | 365/185 |
| 5,091,888 | 2/1992 | Akaogi | 365/185.2 |
| 5,119,330 | 6/1992 | Tanagawa | 365/168 |
| 5,157,626 | 10/1992 | Watanabe | 365/185.2 |
| 5,218,569 | 6/1993 | Banks | 365/189.01 |
| 5,258,958 | 11/1993 | Iwahashi et al. | 365/210 |
| 5,386,388 | 1/1995 | Atwood et al. | 365/201 |

FOREIGN PATENT DOCUMENTS 0 409 697 A1  1/1991  European Pat. Off. .
WO 90/12400  10/1990  WIPO .

OTHER PUBLICATIONS

Bleiker, "A Four–State EEPROM Using Floating–Gate Memory Cells", IEEE Journal of Solid–State Circuits, vol. SC–22, No. 3, Jun. 1987.

Primary Examiner—Joseph A. Popek
Attorney, Agent, or Firm—Fliesler, Dubb, Meyer & Lovejoy, LLP

[57] ABSTRACT

A programmable reference used to identify a state of an array cell in a multi-density or low voltage supply flash EEPROM memory array. The programmable reference includes one or more reference cells, each reference cell having a floating gate which is programmed to control its threshold value. The array cells are read by applying an identical voltage to the gate of the array cell and the reference cell and comparing outputs to determine the array cell state. During read of an array cell, the programmable reference cell is biased the same as the array cell, so that the difference in threshold values between reference cells and array cells remain constant with a change in $V_{CC}$. Circuitry is included for programming the reference cells utilizing a simple resistor ratio. Programming is performed at test time, preferably by the manufacturer, to assure $V_{CC}$ remains within strict tolerances. The array cells are programmed and read without resistor biasing and under looser tolerances using the reference cells at a later time.

16 Claims, 15 Drawing Sheets

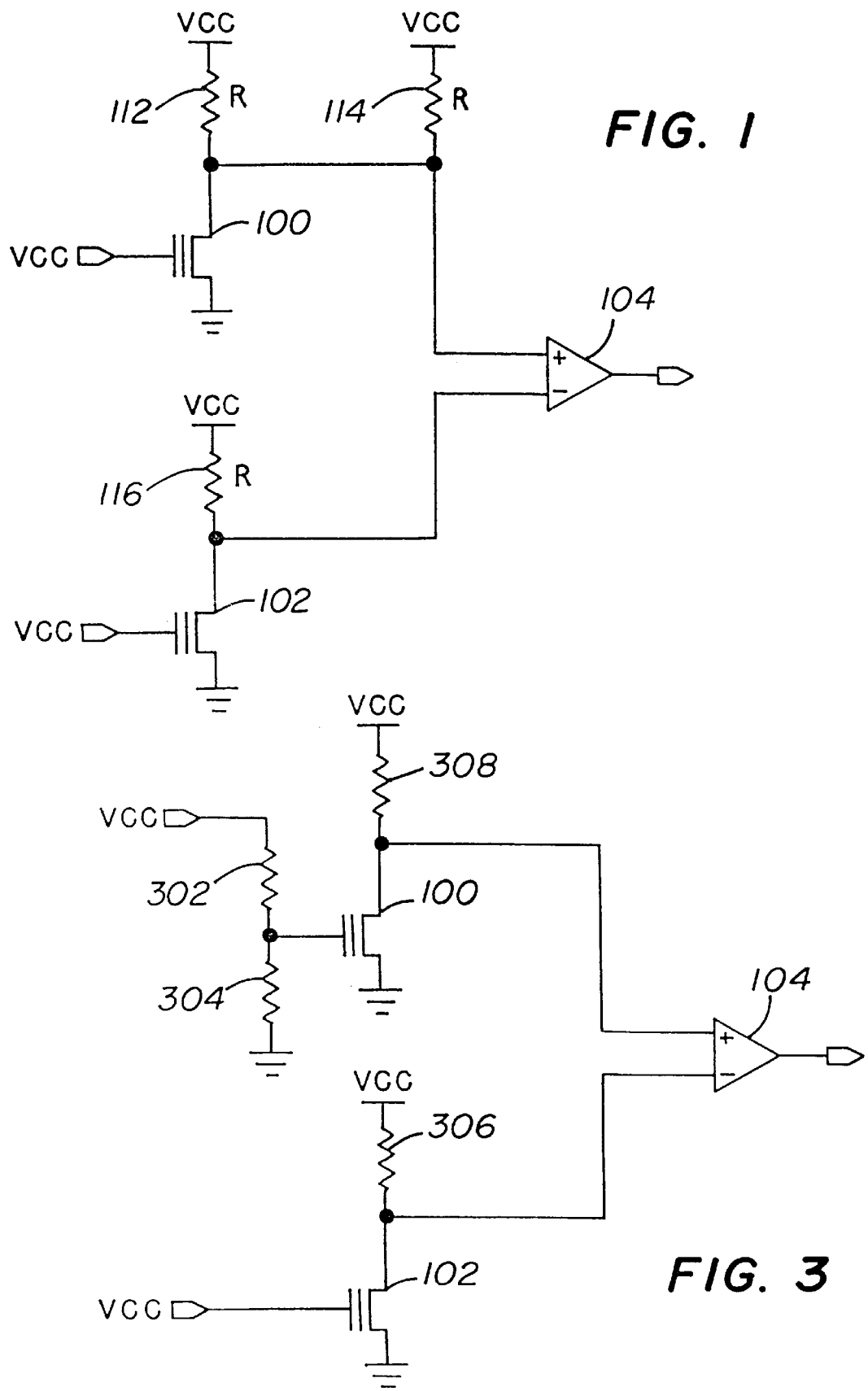

| Voltage | | Label |
|---|---|---|
| 4.00 V | ——————— | 0 STATE |
| 2.90 V | — — — — — | REFERENCE STATE |
| 1.80 V | ——————— | 1 STATE |

SINGLE DENSITY

| Voltage | | Label |
|---|---|---|
| 4.00 V | ——————— | 0 0 STATE |
| 3.45 V | — — — — — | REFERENCE STATE B |
| 2.90 V | ——————— | 0 0.5 STATE |
| 2.35 V | — — — — — | REFERENCE STATE A |
| 1.80 V | ——————— | 1 1 STATE |

3/2 DENSITY

| Voltage | | Label |
|---|---|---|
| 4.00 V | ——————— | 0 0 STATE |
| 3.63 V | — — — — — | REFERENCE STATE C |
| 3.27 V | ——————— | 0 1 STATE |
| 2.90 V | — — — — — | REFERENCE STATE B |
| 2.53 V | ——————— | 1 0 STATE |
| 2.17 V | — — — — — | REFERENCE STATE A |
| 1.80 V | ——————— | 1 1 STATE |

DOUBLE DENSITY

*FIG. 2*

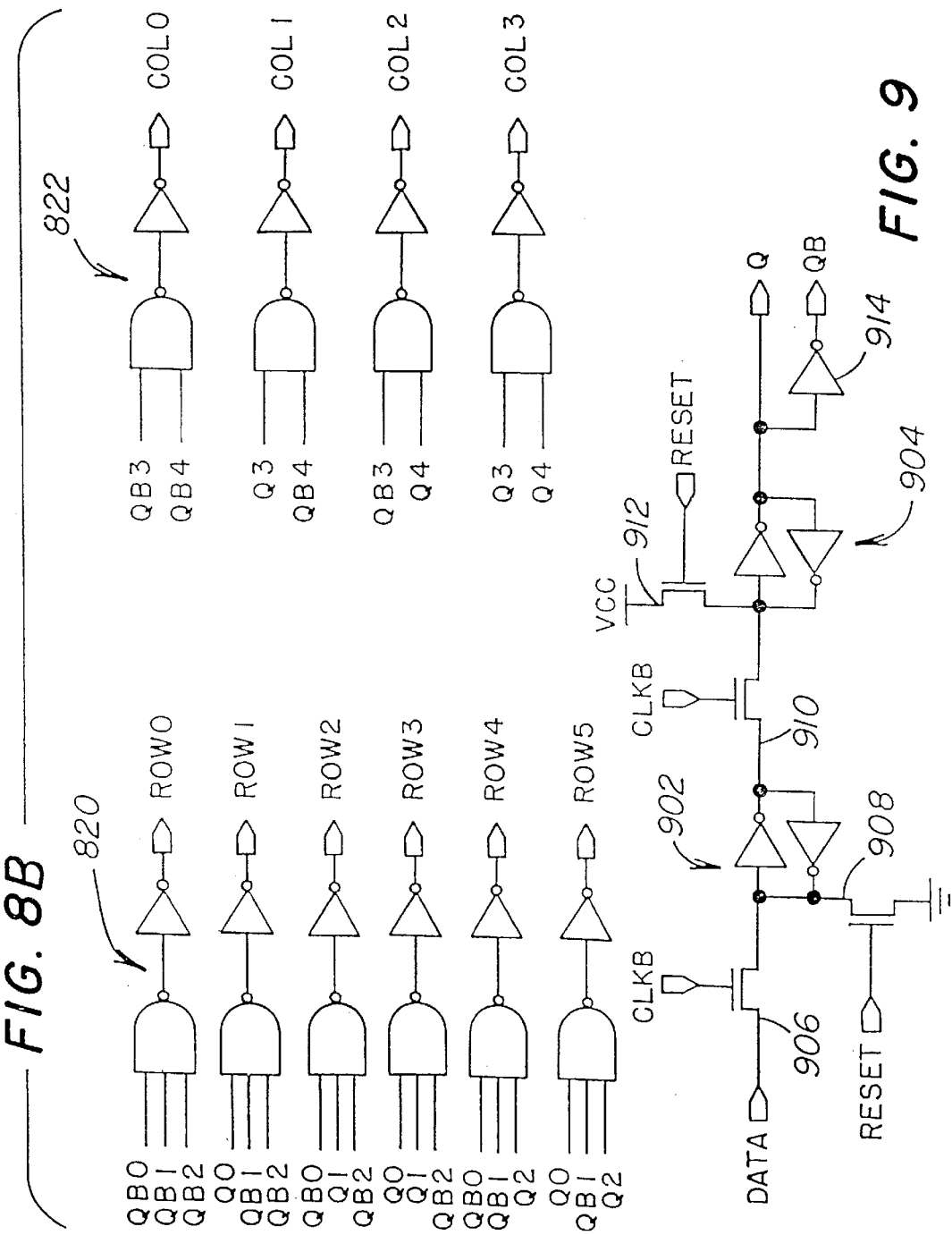

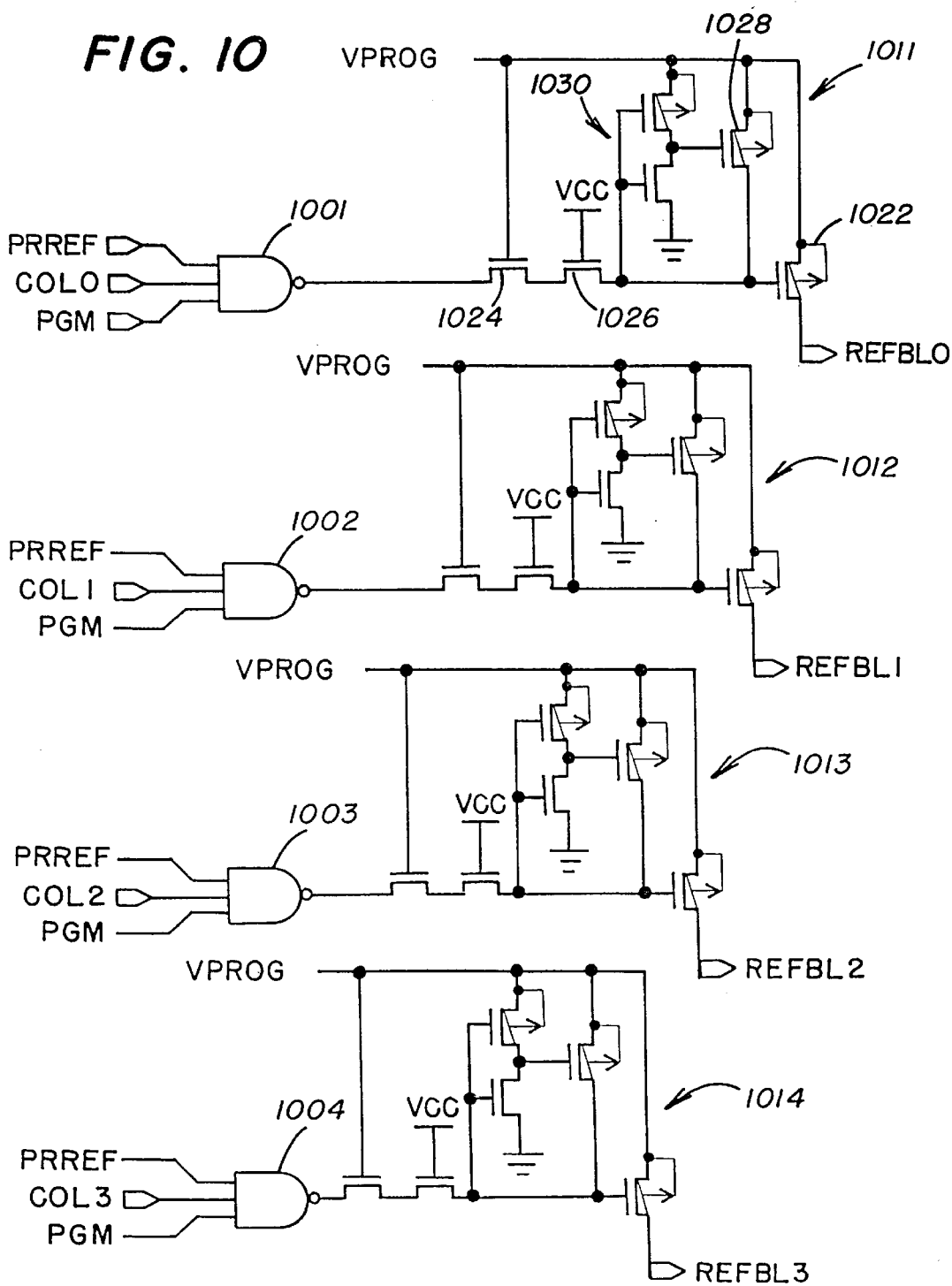

PROGRAMMED REFERENCE

BACKGROUND OF THE INVENTION

1. Field of the Invention

The present invention relates in general to a referencing scheme for memory arrays, and more particularly to a referencing scheme utilized to determine the thresholds of flash electrically erasable programmable read only memory (EEPROM) cells utilized in low voltage supply and multi-density memory arrays.

2. Description of the Related Art

One traditional referencing scheme utilized to determine the threshold of a memory cell includes an unprogrammed reference cell coupled with a sense ratio. FIG. 1 shows such a reference cell 100 coupled with a sense ratio to provide a reference for an array cell 102. The sense ratio is provided by two parallel resistive elements 112 and 114, having the same value R connected between $V_{CC}$ and the drain of array cell 100, and an additional resistive element 116, of value R, connected between $V_{CC}$ and the drain of array cell 102. The drain of reference cell 100 provides a reference output to one input of comparator 104. The drain of array cell 102 provides an array cell output to a second input of comparator 104. The output of comparator 104 indicates the threshold state of array cell 102.

To read the states of the array cell 102 in FIG. 1, $V_{cc}$ is applied to the gates of reference cell 100 and array cell 102. When $V_{CC}$ is applied, the sense ratio will vary the voltage seen by comparator 104 at the drain of reference cell 100 as compared to the drain of array cell 102. The voltage seen by comparator 104 at the drain of reference cell 100 is, thus, $V_{CC} - 1/2RI_D$, whereas the voltage seen by the comparator at the drain of array cell 102 is $V_{CC} - I_D R$. $I_D$ is controlled by the thresholds, $V_t$, of the reference cell 100 and array cell 102 as seen by the saturation equation for a MOS transistor $I_D = K(V_{GS} - V_t)^2$, where $V_{GS}$ here is equal to $V_{CC}$. With both the reference cell 100 and array cell 102 unprogrammed, or having an identical threshold $V_t$, the sense ratio will provide a higher voltage at the reference output to comparator 104 than the array cell output causing comparator 104 to output a first state. With the array cell programmed to have a threshold raised to a certain level, $I_D$ for the array cell will be reduced and the voltage of the array cell output will rise above the voltage at the reference cell output causing comparator 104 to output a second state.

Because the sense ratio method utilizes differing resistor ratios connected to the drains of the reference cell and the array cell, the sense ratio method provides a reference output varying with respect to an array cell output due to temperature and process variations of the resistive elements as well as variations in $V_{CC}$.

The circuitry of FIG. 3 illustrates another traditional referencing scheme called a bias gate method. The bias gate method provides a more accurate reference than the sense ratio method because the effect of process, temperature and $V_{CC}$ variations are reduced with respect to the sense ratio method. The circuitry of FIG. 3 includes an unprogrammed reference cell 100, an array cell 102, and a comparator 104 similar to the sense ratio circuitry of FIG. 2. For convenience, in FIG. 3 and subsequent drawings reference numbers used to identify components carried over from previous drawings are likewise carried over.

Unlike the sense ratio method of FIG. 2 which provides a resistor ratio connected to the drains of reference cell 100 and array cell 102 directly, the circuitry of FIG. 3 has a resistor ratio connected to the gate of reference cell 100 to vary $V_{GS}$. The resistor ratio is provided by resistive element 302 connected between $V_{CC}$ and the gate of reference cell 100 along with a resistive element 304 connecting the gate of reference cell 100 to ground. The drain of reference cell 100 provides a reference output to one input of comparator 104. The drain of array cell 102 provides an array cell output to a second input of comparator 104. Identical resistive elements 306 and 308 connect $V_{CC}$ to the reference and array cell outputs to convert their $I_D$ output to a voltage at the inputs of comparator 104. By varying $V_{GS}$ instead of directly varying $I_D$, process and temperature effects on the resistive elements and $V_{CC}$ variations cause less variation between the reference cell and array cell outputs than with the sense ratio method.

To read the state of the array cell 102 in FIG. 3, a voltage, $V_{CC}$, is applied directly to the gate of array cell 102 while being applied through resistive elements 302 and 304 to the gate of reference cell 100. With both the reference cell 100 and array cell 102 unprogrammed, or having an identical $V_t$, resistive elements 302 and 304 will provide a lower $V_{GS}$, and thus a lower $I_D$ at the reference cell output to comparator 104 than the current at the array cell output causing comparator 104 to indicate a first state. With the array cell programmed to have a threshold raised to a certain level, the array cell output will rise above the reference cell output causing comparator 104 to output a second state.

With reference schemes such as the sense ratio and bias gate schemes, variations of the reference output with respect to the array cell output due to process, temperature and $V_{CC}$ variations can cause read errors. The potential for error is more significant with memories having a low working margin between array cell threshold states such as in multi-density or low voltage supply memories. FIG. 2 shows the reference levels and array cell threshold states for a typical multi-density memory configured to be single density, 3/2 density and double density. As indicated, as the density is increased, the working margin between reference levels and array cell states decreases. For instance, utilizing single density, the margin between the 0 state and the reference state is (4.00–2.9 V=1.10 V.) With 3/2 density, the margin is reduced by 50% (4.00 V–3.45 V=0.55 V), and for double density the margin is reduced to 0.33 V. The working margin in low voltage supply memories is limited because a reduction in Vcc limits the range available for array cell threshold states. With a low working margin, a reference is needed which tracks variations in the electrical characteristics of an array cell to reduce potential errors.

SUMMARY OF THE INVENTION

The present invention provides a referencing scheme with a reference which tracks the variations in the electrical characteristics of an array cell.

The present invention is a programmable reference including one or more reference cells, each reference cell having a floating gate which is programmed in a controlled environment to set its threshold value. To read the state of an array cell, an identical voltage, $V_{CC}$, is applied to the gate of an array cell and the reference cell. Additionally, the outputs of the array cell and the reference cell are maintained under the same bias conditions. During read, the reference cell drain provides an output which is compared with an array cell drain output to determine the threshold of the array cell with respect to the threshold of a reference cell.

The present invention further includes circuitry for programming the reference cells utilizing the bias gate method for biasing with respect to an unprogrammed cell. The reference cells are programmed at test time, preferably by the manufacturer, to assure $V_{CC}$ and temperature remain within strict tolerances to eliminate variations when programming the reference thresholds using the bias gate method. The array cells are then programmed and read under looser Vcc and temperature tolerances using the reference cells thereafter.

During read of an array cell, the reference cells and array cells are maintained under the same bias conditions rather than using a sense ratio or a biased gate method, thus reducing the effect of process variations on the reference and array cell outputs. Because $V_{CC}$ is applied as a read voltage identically to the gate of a reference cell and an array cell, the working margin between the reference cell and array cell outputs remains substantially constant with changes in $V_{CC}$. To assure the changes in threshold values remain constant with temperature, the array cells and reference cells are also preferably included as core cells on the same integrated circuit.

BRIEF DESCRIPTION OF THE DRAWINGS

Further details of the present invention are explained with the help of the attached drawings in which:

FIG. 3 shows circuitry for providing a reference for a memory using a bias gate method;

FIG. 9 shows circuitry for shift registers utilized in FIG. 8;

FIG. 10 shows circuitry for the data buffer reference circuit shown in FIG. 6;

DETAILED DESCRIPTION

Figure 4A:
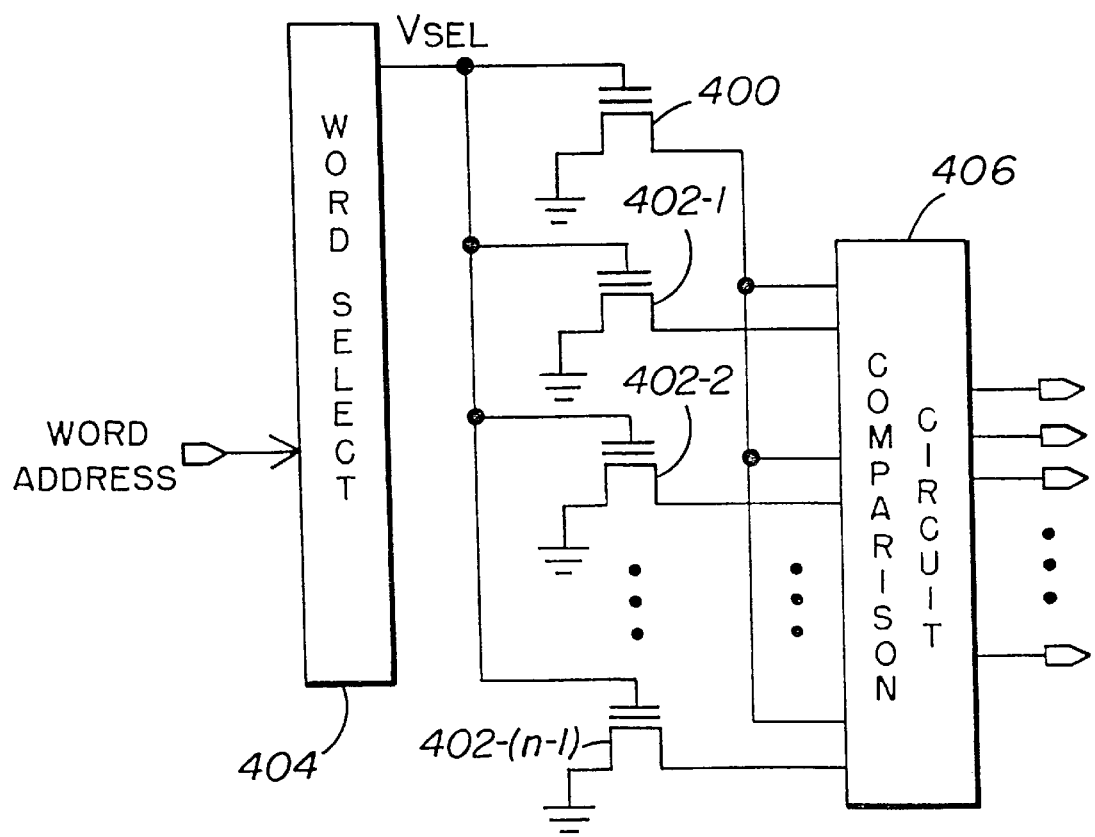
FIG. 4A shows an array cell along with programmable reference cells of the present invention utilized to read the array cell.

FIG. 4A shows an array cell 400 along with programmable reference cells 402-1 through 402-(n–1) of the present invention utilized to read array cell 400. Array cell 400 is read by applying a word address which is decoded in word select circuit 404 to provide a select voltage $V_{SEL}$ to the gate of array cell 400. The select voltage is identically applied to the gates of reference cells 402-1 through 402-(n–1). $V_{SEL}$ may be $V_{cc}$, $V_{DD}$, or a boosted gate voltage as disclosed in U.S. patent application Ser. No. 08/160,578 entitled "Boosted and Regulated Gate Power Supply With Reference Tracking for Multi-Density and Low Voltage Supply Memories" by the present inventors filed on Dec. 1, 1993, incorporated herein by reference. The output of array cell 400 is connected with one or more outputs of reference cells 402-1 through 402-(n–1) of the present invention to a comparison circuit 406. Comparison circuit 406 outputs a signal indicating the state of array cell 400.

Although array cell 400 is shown as a transistor with a floating gate having a programmable threshold, array cell 400 may be a ROM transistor having a fixed threshold. Array cell 400 stores one of n threshold values indicative of states such as the 0 0 state, the 0 0.5 state or 1 1 state of the 3/2 density cell as shown in FIG. 2.

The reference cells 402-1 through 402-(n–1) each have a floating gate which stores an electrical charge which may be programmed to set a reference threshold value. A total of n–1 reference cells are utilized which are each programmed to a successive threshold level, such as reference states A and B of the 3/2 density cell of FIG. 2. By similarly biasing reference cells 402-1 through 402-(n–1) and the array cell 400 and applying an identical voltage, $V_{SEL}$, to their gates, the thresholds of reference cells 402-1 through 402-(n–1) can be compared with the array cell 400 threshold.

Comparison circuitry 406 compares the thresholds by comparing the output of the array cell 400 to the outputs of reference cells 402-1 through 402-(n–1) when the select voltage $V_{SEL}$ is applied. Typical circuitry for the comparison circuitry 406 is shown in U.S. Pat. No. 5,218,569 by Banks entitled "Electrically Alterable Non-volatile Memory With N-Bits Per Memory Cell" and U.S. Pat. No. 4,495,602 by Sheppard entitled "Multi-bit Read Only Memory Circuit, both incorporated herein by reference. The comparison circuitry 406 outputs comparison results as a digital signal having the number of bits capable of being identified by threshold states storable by array cell 400.

Figures 1, 4B:
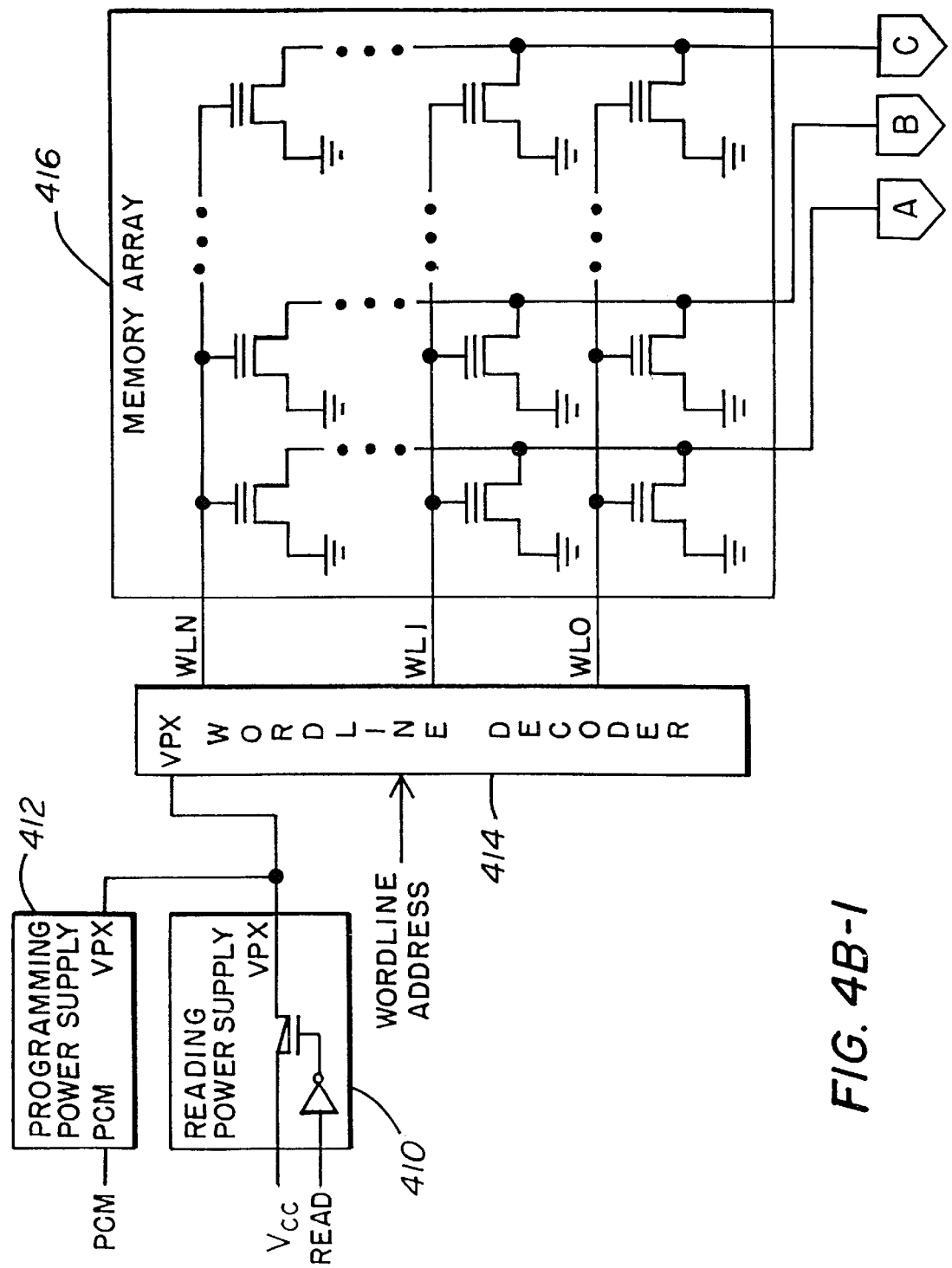
FIG. 1 shows circuitry for providing a reference for a memory array using a sense ratio method.
FIG. 4B shows another embodiment of circuitry of the present invention utilized to read multiple array cells from a memory array.
Figures 2, 4B:
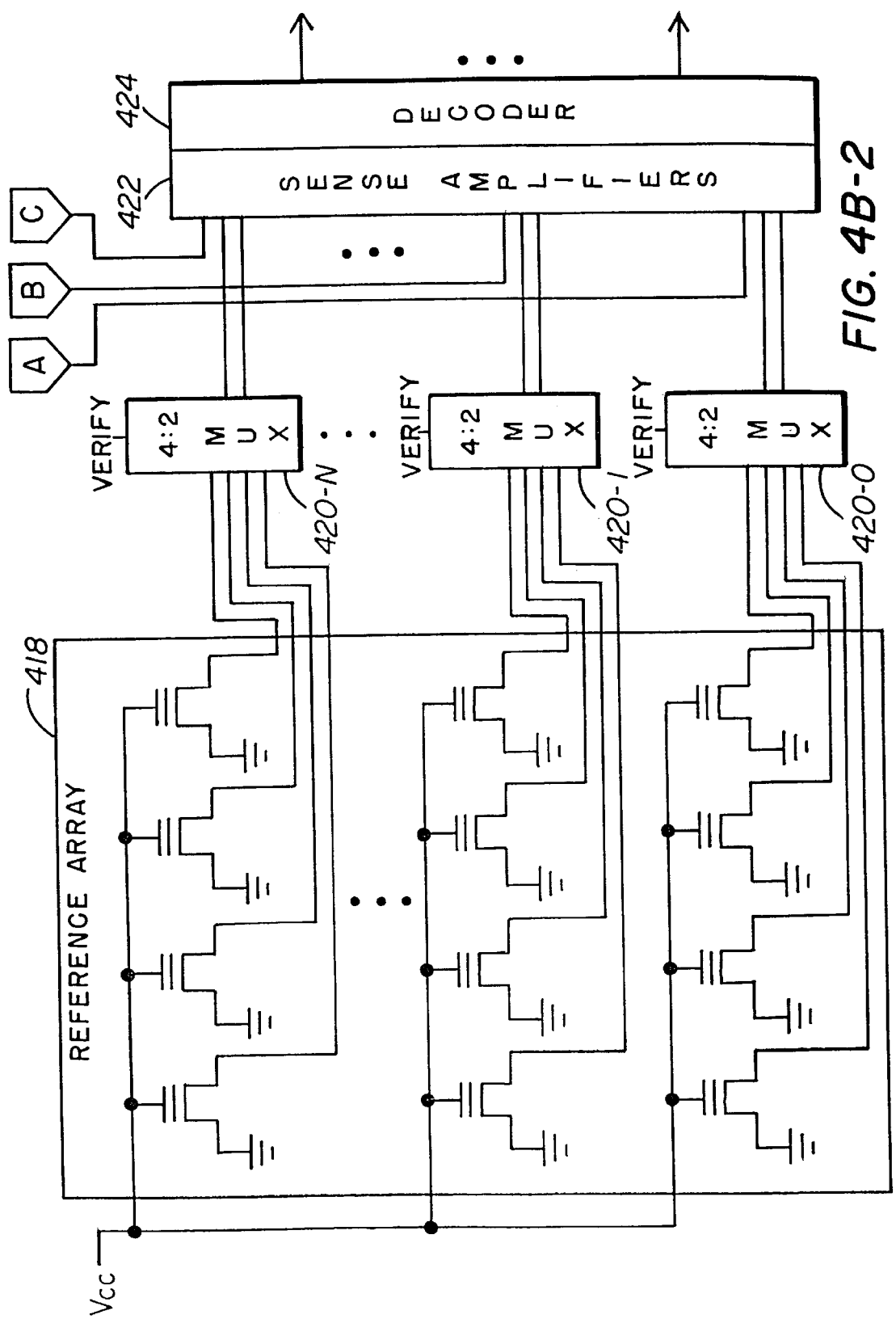
FIG. 2 shows the reference levels needed for a single density, a 3/2 density and double density memory.

Fig. 4B shows another embodiment of circuitry of the present invention utilized to read multiple array cells from a memory array 416 containing 3/2 density memory cells. FIG. 4B further includes a reference array 418 with the reference cell gates powered directly by $V_{CC}$. Unlike FIG. 4A, voltage is not connected to the programmable reference cells through the wordline selector or decoder as is $V_{SEL}$ in FIG. 4A because a large negative gate voltage typically applied over wordlines during erase would erase any connected reference cell.

Along with the memory array 416 and reference array 418, FIG. 4B includes a reading power supply 410 and a programming power supply 412 which provide power to a wordline decoder 414. During application of a READ signal, reading power supply 410 supplies $V_{CC}$ to wordline decoder 414 as a signal VPX. During application of a program signal (PGM), a boosted signal greater than $V_{CC}$ is supplied by programming power supply 412 to wordline decoder 414 as a signal VPX, The program signal PGM is applied to increase electrons stored on the floating gate of a memory cell. During application of an erase signal, a large negative voltage is applied by circuitry (not shown) to the gates of the array cells of memory array 416. The erase voltage is applied to remove electrons from the floating gate of a memory cell. The wordline decoder 414 decodes the wordline address to select VPX to one of wordlines WL0-WLN. Each wordline WL0-WLN is connected to the gates of a row of array cells in memory array 416. Bitlines of cells in a row are connected to corresponding array cells in the remaining rows to provide a memory array output to sense amplifiers 422.

Reference array 418 is shown containing groups of four cells as required for a 3/2 density memory, although more or less cells may be utilized for different densities. For the 3/2 density reference array 418, two cells in a group of four cells provide reference states A and B utilized to read the state of a memory cell, while the remaining two cells provide the 0 0 and 0 0.5 states utilized to program a threshold of an array cell in memory array 416. Note that the 1 1 state is the unprogrammed state and does not require a reference.

Multiplexers 420-0 through 420-N are each connected to the drains of respective groups of four reference cells in reference array 418. A VERIFY signal is supplied to each of the multiplexers which in a high state indicates the READ signal is being applied to verify if the array cell has been fully programmed, If the VERIFY signal is high, the multiplexer will couple the references storing the 0 0 and 0 0.5 states to sense amplifiers 422 to enable determination if an array cell has been properly programmed. If the VERIFY signal is low, the multiplexer will couple the references storing the reference state A and B values to sense amplifiers 422 to enable reading of an array cell.

Sense amplifiers 422 individually compare the array cell bitline drain currents from memory array 416 to respective reference cell drain currents output from multiplexers 420-0 through 420-N to determine the state of each selected array cell with respect to each reference. Decoder 424 then decodes the output of the two sense amplifiers for each selected array cell to provide an output corresponding to the state stored by each selected array cell.

Figure 5:
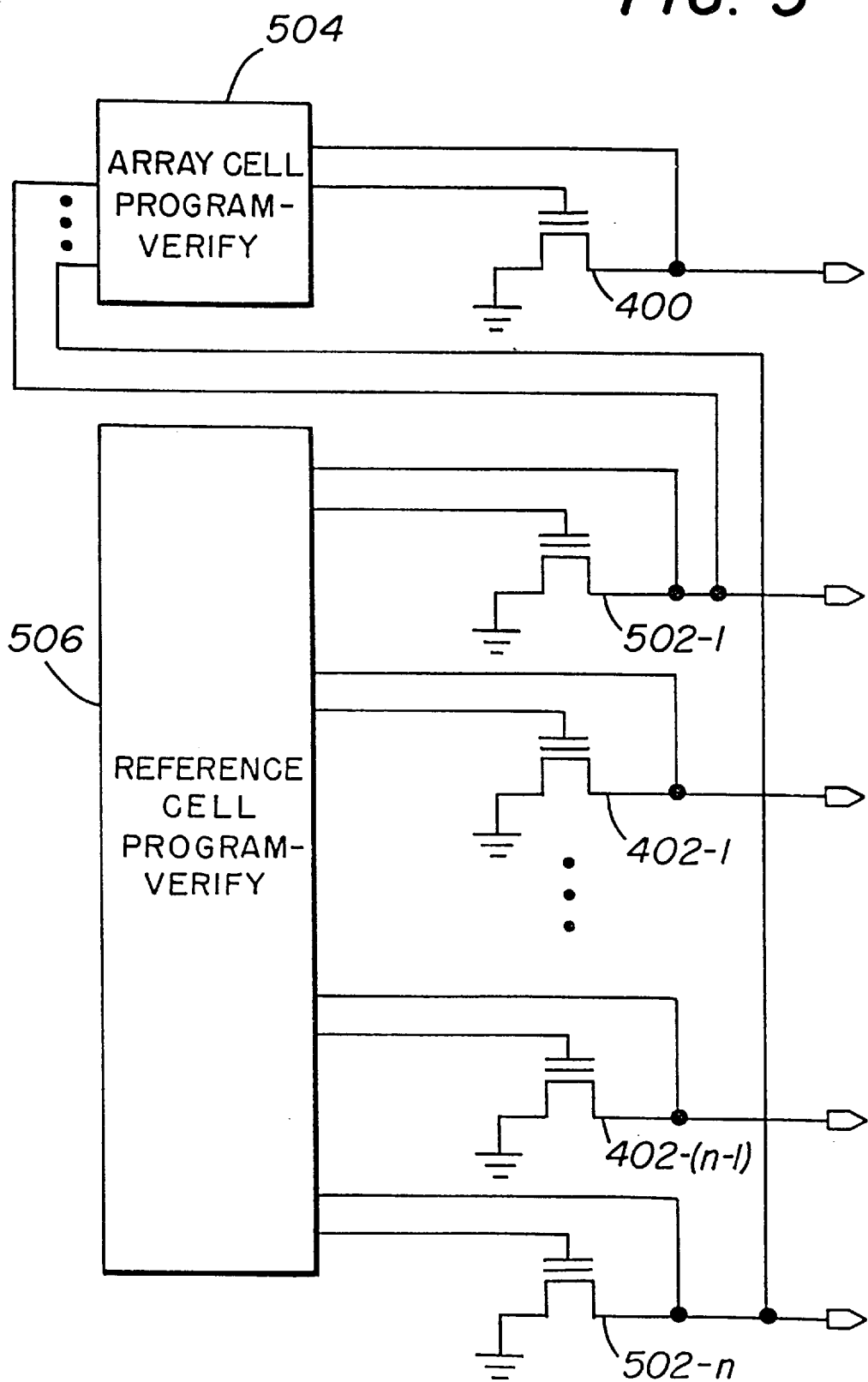
FIG. 5 shows a block diagram of circuitry utilized to program an array cell as well as reference cells utilized during program and read of the array cell.

FIG. 5 shows a block diagram of circuitry connected to program array cell 400 as well as reference cells 402-1 through 402-(n-1) and 502-1 through 502-n of the present invention utilized to program array cell 400. Array cell program-verify circuit 504 is provided to program array cell 400 while reference cell program-verify circuit 506 is provided to program the reference cells. Reference cells 502-1 through 502-n have programmable threshold values each programmed to one of the n states such as the 0 0 state, 0 0.5 state, or the 1 1 state as shown for a 3/2 density cell in FIG. 2, the states being between states such as states A and B of the 3/2 density design which are storable by reference cells 402-1 through 402-(n-1).

Array cell program-verify circuit 504 is connected to the gate and drain of array cell 400 to program array cell 400. Array cell program-verify circuit 504 is also connected to the drains of reference cells 502-1 through 502-n to compare the array and reference cell outputs to determine if array cell 400 is properly programmed. Typical circuitry for an array cell program-verify circuit 504 along with the method utilized to program a multi-density cell is shown and described in U.S. Pat. No. 5,218,569 by Banks as cited previously.

Reference cell program-verify circuit 506 is connected to the gates and drains to allow programming of reference cells 402-1 through 402-(n-1) as well as reference cells 502-1 through 502-n. The reference cell program-verify circuit 506 utilizes traditional methods to supply program and verify voltages to enable programming of the reference cells. The reference program-verify circuitry 506 further utilizes circuitry for biasing each reference with respect to an unprogrammed cell utilizing the bias gate method to verify proper programming. Circuitry is further provided to sequence through each of the reference bits to enable a proper bit line and word line of a reference cell being programmed.

Reference program-verify circuitry 506 is utilized to program the references at test time, preferably by the manufacturer, so that $V_{CC}$ and temperature remain within strict tolerances to eliminate variations in setting reference thresholds when utilizing the biased gate method. Array program-verify circuit 504 is utilized at a later time to program the array cells using looser $V_{CC}$ and temperature tolerances.

Figure 6A:
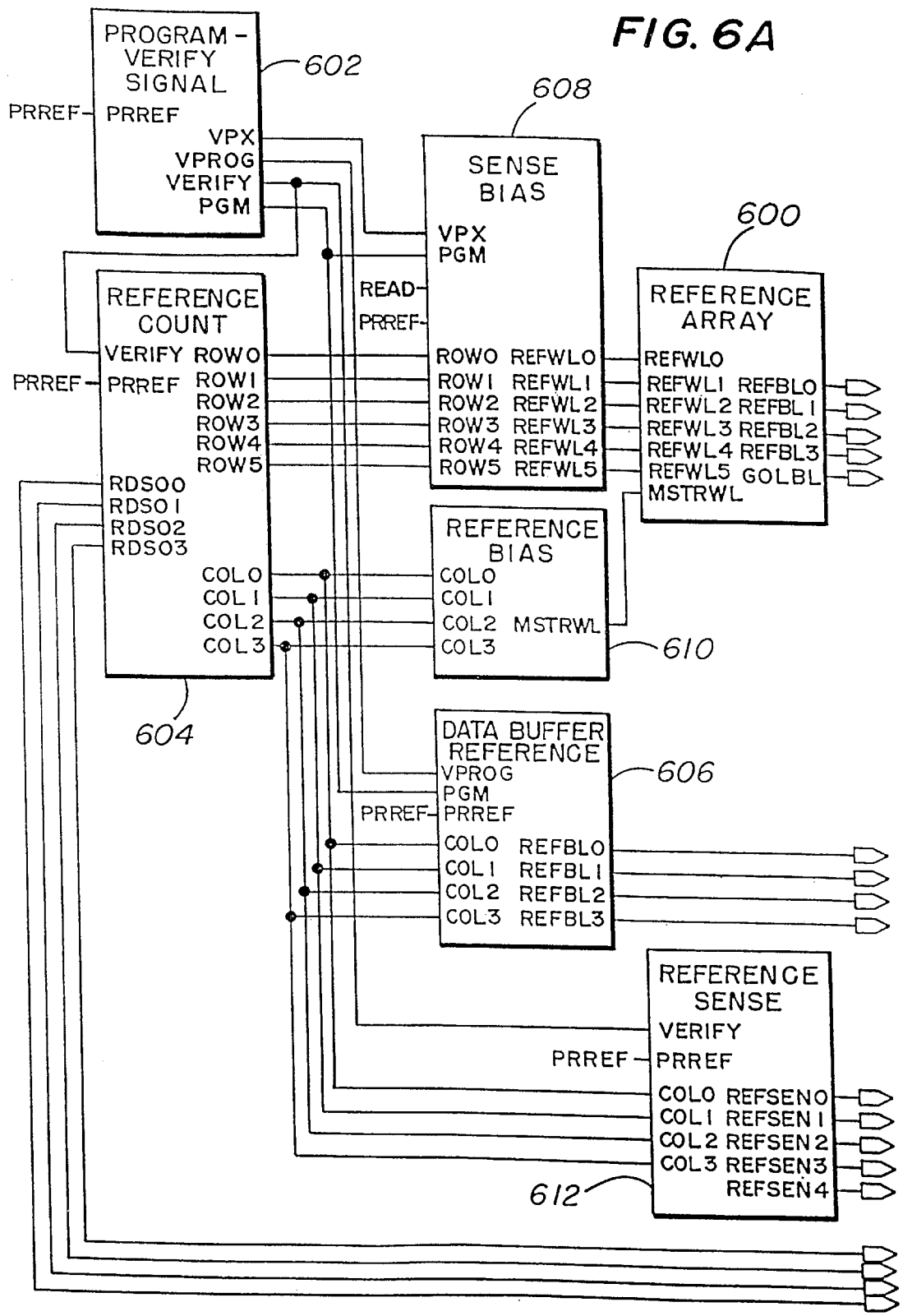
FIG. 6 illustrates an embodiment of the programmed reference of the present invention designed for a 3/2 density memory array.
Figure 6B:
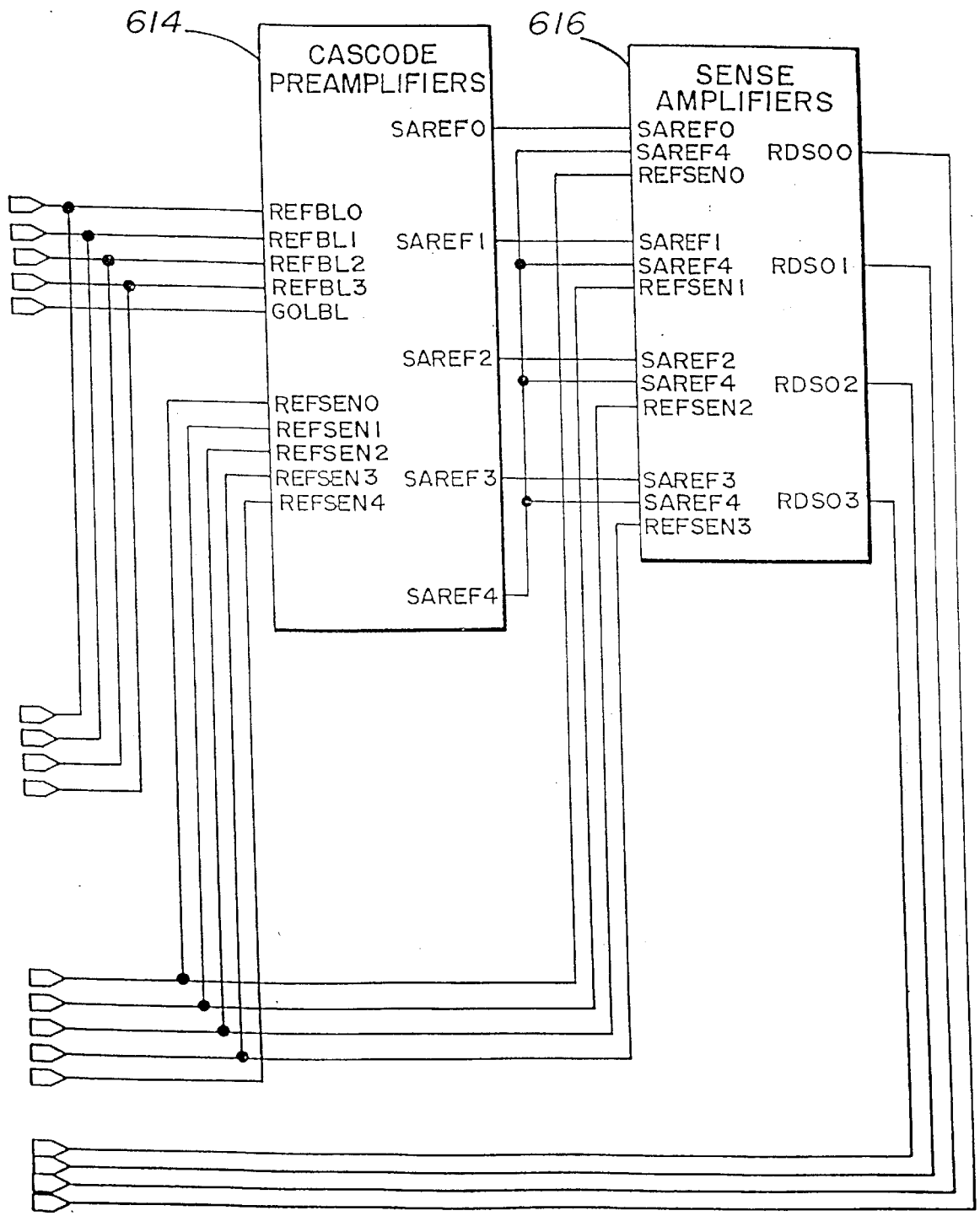

FIG. 6 illustrates an embodiment of the programmed reference of the present invention designed for a 3/2 density memory array as shown in FIG. 2. FIG. 6 includes components which make up the reference cell program-verify circuitry 506 of FIG. 5 along with a reference array 600 containing reference cells to be programmed. To reduce the amount and complexity of circuitry required to program the reference cells, the circuitry of FIG. 6 is designed to program the reference cells one cell at a time.

The circuit of FIG. 6 includes program-verify signal circuitry 602 which, upon receiving a PRREF signal indicating that references are to be programmed, alternately produces program and verify signals to program an individual reference cell. A program voltage applied to the drain of a reference cell during program is supplied as the signal VPROG. A signal VPX alternately carries a program voltage and a verify voltage to the gate of a reference cell to program the reference cell. VPX carries a read voltage during reading or verifying the programming of array cells. During verify, a signal VERIFY is asserted. During program a signal PGM is asserted. Traditional circuitry for programming a single floating gate memory cell can be utilized to provide the program-verify signal circuitry 602. Such traditional circuitry is generally described in U.S. Pat. No. 5,218,569 by Banks as discussed previously.

To sequence through all the reference cells and direct the program and verify voltages to a selected cell, control logic is provided to enable a proper reference bit line and reference word line. The control logic consists of a reference count circuit 604 along with some mixed logic. Reference count circuit 604 begins sequencing upon receipt of the PRREF signal and provides a column signal (COL0–COL3) and a row signal (ROW0–ROW5) to indicate which reference cell is to receive program and verify voltages. Reference count circuit 604 sequences to a next reference cell bit when a signal RDSO–RDSO3 and VERIFY are provided indicating the previous cell has been properly programmed.

The data buffer reference 606 and sense bias circuit 608 decode the column and row signals output by reference count circuit 604 to provide the program and verify voltages to a selected reference cell. The data buffer reference 606, upon receiving PRREF and PGM, decodes the column signal (COL0–COL3) to direct the program voltage signal VPROG on one of reference bit lines (REFBL0–REFBL3) to the drains of a column of reference cells in reference array 600. The sense bias circuit 608, upon receiving PRREF, decodes the row signal (ROW0–ROW3) to direct the program and verify voltage signal VPX on one of reference word lines (REFWL0–REFWL5) to the gates of a row of reference cells in reference array 600. Sense bias circuit 608 also receives a read signal to apply VPX to all the wordlines during read or verify of an array cell. PGM is received to disable the sense bias circuit 608 during programming of an array cell.

One bit in reference array 600 is provided as a reference for programming the reference bits. This bit is referred to as the golden reference. To bias the gate of the golden reference utilizing the bias gate method, one of several resistor ratios provided by reference bias circuit 610 can be connected on a master word line (MSTRWL) to the gate of the golden reference. The particular resistor ratio of reference bias circuit 610 is controlled by the column signal (COL0–COL3) received from reference count circuit 604.

To verify if a reference signal has been properly programmed, the program reference includes reference sense circuit 612, cascode preamplifiers 614, and sense amplifiers 616. When VERIFY and PRREF are asserted, the reference sense circuit 612 decodes the column signal (COL0–COL3) to provide an enable signal (REFSEN0–REFSEN4) to enable proper cascode preamplifiers of circuitry 614 and sense amplifiers of circuitry 616. The enabled cascode preamplifier of circuit 614 is connected to receive a current from the bit line (REFBL0–REFBL3) of the reference cell being programmed to provide an enabled reference cell output voltage (SAREF0–SAREF3). An additional cascode preamplifier of circuit 614 is connected to receive a current from the bit line (GOLBL) of the golden reference to provide a golden reference output voltage (SAREF4) when an enabling signal (REFSEN0–REFSEN4) is received. The enabled sense amplifier of circuit 616 compares the enabled reference cell output voltage (SAREF0–SAREF3) to the golden reference output voltage (SAREF4) and outputs a signal (RDSO0–RESO3) indicating if the enabled reference cell output voltage and the golden reference cell output voltage are substantially equal.

Detailed circuitry for the components of FIG. 6 are shown in subsequent figures which are described below.

Reference Array 600

Figure 7:
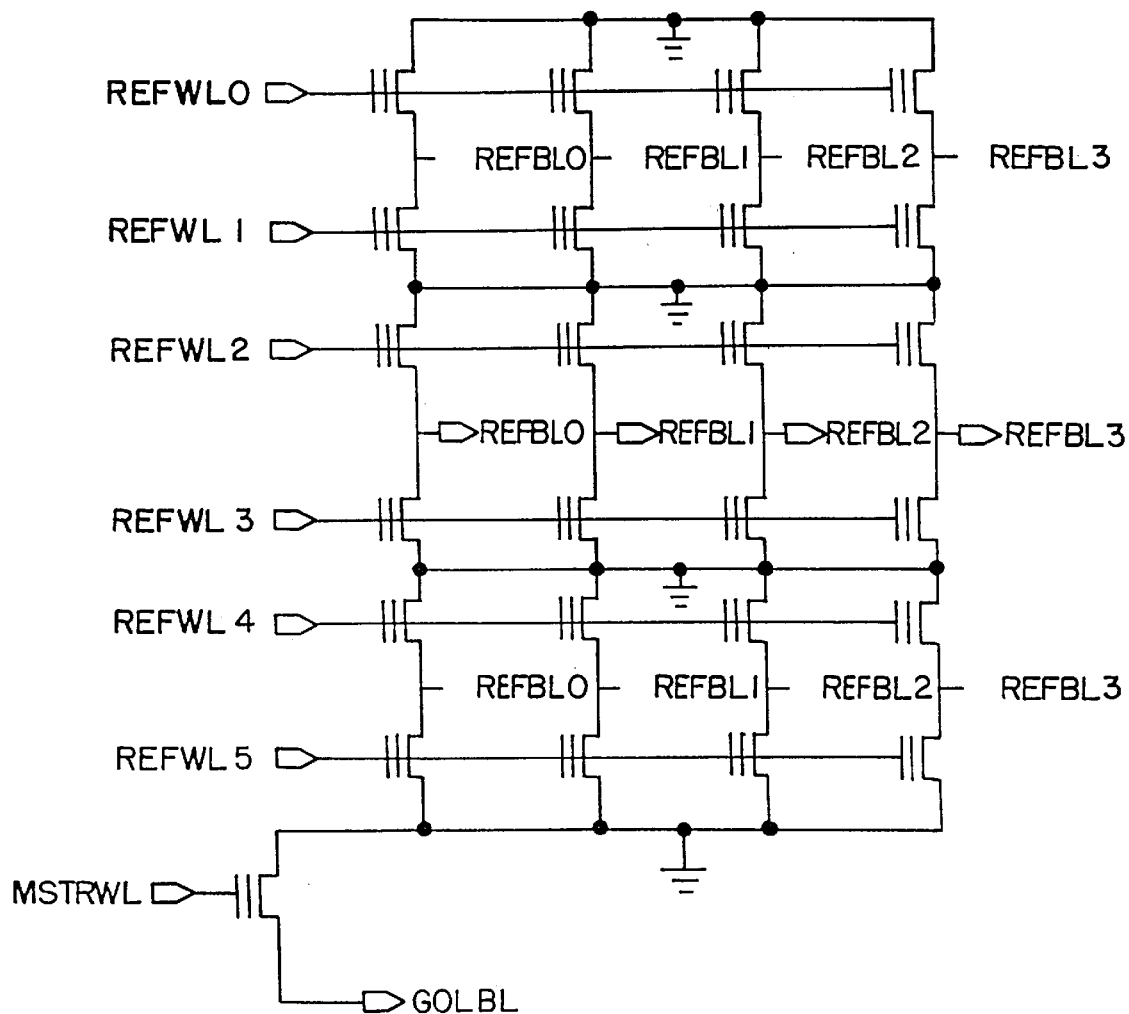
FIG. 7 shows circuitry for the reference cells and the golden reference of the reference array shown in FIG. 6.

FIG. 7 shows circuitry for the reference cells and the golden reference of the reference array 600 shown in FIG. 6. Word line connections (REFWL0–REFWL5) are provided to the gates of the reference cells and bit line connections (REFBL0–REFBL3) are provided to drains of the reference cells. The reference cells have floating gates which may be programmed to a predetermined threshold value.

The circuitry of FIG. 6 includes a total of twenty-four reference cells as required for a 3/2 density design having an eight bit output. As seen from the 3/2 density design values in FIG. 2, four reference cells are required to provide four reference cell bit line outputs to an array cell. Two reference cells provide the reference state A and B values needed during read to determine an array cell threshold state. Two additional reference cells provide the 0 0 state and 0 0.5 state values needed to verify proper programming of an array cell, the 1 1 state being an unprogrammed state. Six sets of the four reference cells are required to provide six different sets of four bit line outputs to six different array cells to provide an eight bit output. Six array cells are utilized in a 3/2 density design to provide an eight bit output because with each array cell storing one of three possible states, instead of two as with a single density design, only six cells are required to store the possible values required to represent eight bits.

The circuitry of FIG. 7 further includes the golden reference cell with a word line connection (MSTRWL) and a bit line connection (GOLBL). The golden bit has a UV-erased floating gate which remains unprogrammed. The reference cells of FIG. 7 are preferably included as core cells on the same integrated circuit as array cells which utilize the reference cells for program and read so that with temperature and process variations, variations between the reference cells and array cells remain substantially uniform.

Reference Count Circuit 604

Figure 8A:
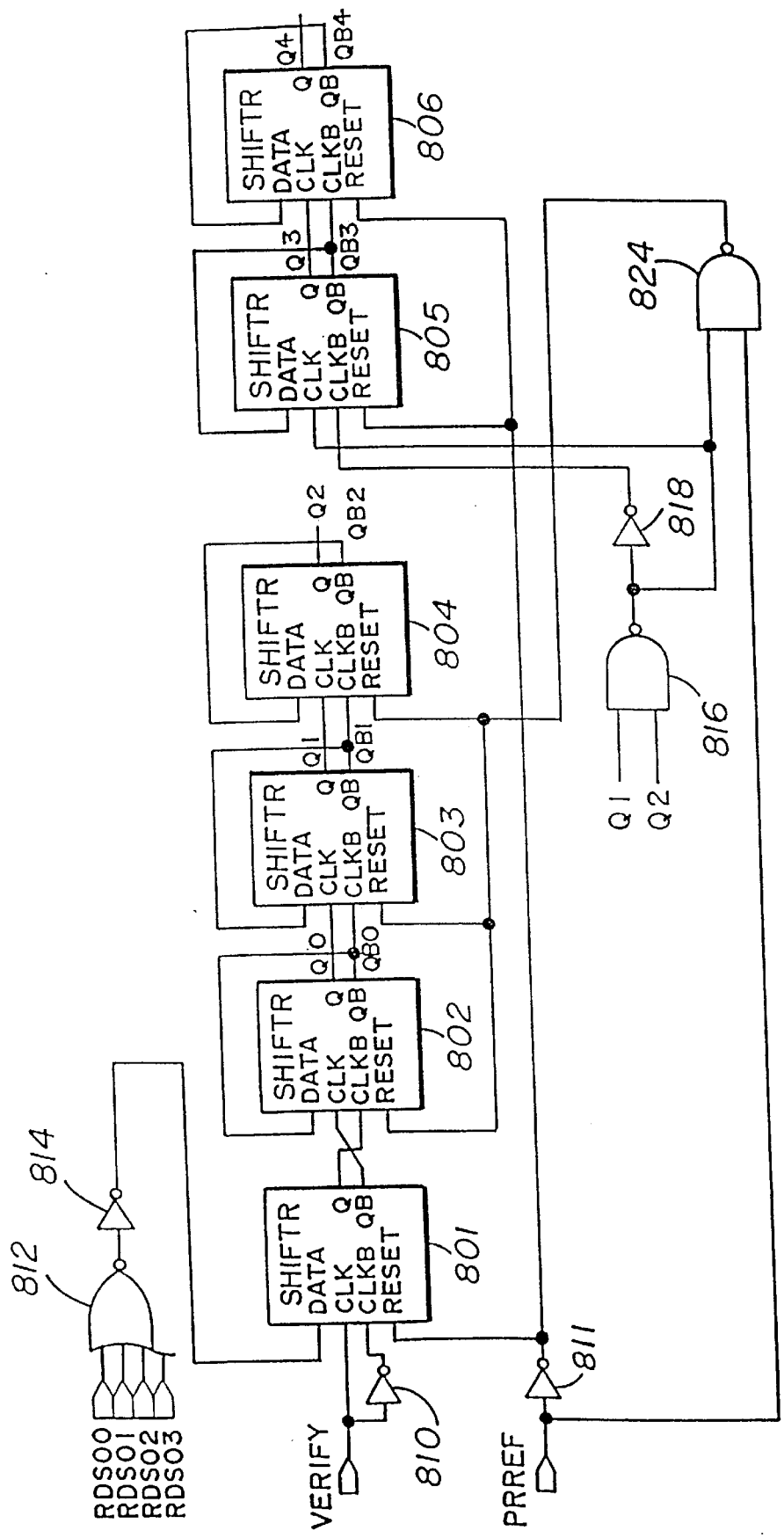
FIG. 8 shows circuitry for the reference count circuit shown in FIG. 6.

FIG. 8 shows circuitry for the reference count circuit 604 of FIG. 6. To provide a counter, the circuitry of FIG. 8 includes a plurality of shift registers 801–806. To synchronize counting, the VERIFY signal is applied to the CLK input of shifter 801 and through an inverter 810 to the CLKB input of shifter 801. The RDSO0–RDSO3 signals are received and ORed by NOR gate 812 and inverter 814 to provide the DATA input 10 of shifter 801. When a bit is verified to be programmed, one of the RDSO0-RDSO3 signals will be asserted so that on the falling edge of VERIFY, Q and QB of shifter 801 will change states.

The Q and QB outputs of shifter 801 are connected to the CLKB and CLK inputs of shifter 802 respectively. Further, the Q and QB outputs of shifters 802 and 803 are connected to respective CLK and CLKB inputs of shifters 803 and 804 while the QB outputs of shifters 802, 803 and 804 are fed back to their respective DATA inputs. The Q and QB outputs of shifters 802, 803 and 804 form Q0, QB0, Q1, Q10, Q2 and Q20 outputs respectively. The Q1 and Q2 outputs are connected through a NAND gate 816 to the CLK input of shifter 805, while the output of NAND gate 816 is connected through inverter 818 to the CLKB input of shifter 805. The Q and QB outputs of shifter 805 are connected to the CLK and CLKB inputs of shifter 806 while the QB outputs of shifters 805 and 806 are fed back to their respective DATA inputs. The Q and QB outputs of shifters 804 and 805 form Q3, QB3, Q4, and QB4 outputs respectively.

To provide the ROW0–ROW5 and COL0–COL3 output signals, logic circuitry is provided as connected to the Q10–Q4 and QB10–QB4 outputs of shifters 802–806. Logic circuitry 820 is connected as shown to several combinations of the Q0–Q2 and QB0–QB2 outputs to sequence through row bits (ROW0–ROW5), while the column being worked on (COL0–COL3) is updated as controlled by combinations of the Q3, QB3, Q4, and QB4 outputs connected to logic 822.

To reset the shift registers upon entering the program reference mode, shift registers 801, 805 and 806 have resets connected to receive the complement of the PRREF signal through inverter 811. Further, shift registers 802–804 receive the complement of the PRREF signal through NAND gate 824 upon entering the program reference mode. The output of NAND gate 816 is further connected through NAND gate 824 to reset shift registers 802–804 when the column being worked on is updated.

FIG. 9 shows circuitry for the shift registers 801–806 of FIG. 8. The shift register of FIG. 9 includes two latches 902 and 904. A transistor 906 has a current path coupling a DATA input signal to the input of latch 902. Transistor 906 has a gate connected to a CLK input. The input of latch 902 is further connected to ground through transistor 908 which has a gate connected to a RESET input. A transistor 910 has a current path coupling the output of latch 902 to the input of latch 904 as controlled by a CLKB input connected to its gate. The input of latch 904 is further connected to $V_{cc}$ through transistor 912 as controlled by the RESET input. The output of latch 904 provides the Q output of the shifter while the QB output is provided from the output of latch 904 through an inverter 914.

Data Buffer Reference Circuit 606

FIG. 10 shows circuitry for the data buffer reference circuit 606 shown in FIG. 6. The circuitry of FIG. 10 receives the PRREF signal when the program reference mode is entered, the PGM signal from program-verify signal circuit 602 indicates a programming signal is applied, and the COL0–COL3 signals output from the reference count circuit 604 as shown in FIG. 6. The PRREF and PGM signals are connected along with each of the COL0–COL3 signals to inputs of respective NAND gates 1001–1004 to enable one of buffers 1011–1014 when the PRREF, PGM and a respective COL0–COL3 inputs are enabled. Buffers 1011–1014 receive the high voltage VPROG signal from the program-verify signal circuit 602 of FIG. 6 and provide VPROG to a respective reference cell bit line (REFBL0–REFBL3) when its respective buffer is enabled. When VPROG is not applied, the REFBL0–REFBL3 outputs present a high impedance.

Buffers 1011–1014 have identical circuitry, so only the circuitry of buffer 1011 will be described. Buffer 1011 receives a select input signal from the output of NAND gate 1001 at the gate of p-channel transistor 1022 which has a current path coupling VPROG to REFBL10. Thus, when the buffer is not selected, transistor 1022 provides a high impedance output on line REFBL10. An n-channel transistor 1024 is connected between the gate of transistor 1022 and the output of NAND gate 1001 with its gate connected to VPROG to provide protection if VPROG should drop below $V_{CC}$. Since VPROG has a value significantly higher than $V_{CC}$, to prevent feedback of VPROG, an n-channel transistor 1026 with a gate connected to $V_{CC}$ is connected between the gate of transistor 1022 and the output of NAND gate 1001. Another p-channel transistor 1028 couples VPROG to the input of transistor 1022 to assure transistor 1022 remains off when buffer 1011 is deselected. Transistor 1028 has a gate controlled by an inverter 1030, inverter 1030 having an gate connected to the input of transistor 1022 and power supplied by VPROG. As shown in FIG. 10, and in subsequent drawings, an angled line from the drain to source of a transistor, such as on transistor 1022, indicates a p-channel transistor, while no line indicates an n-channel transistor.

Sense Bias Circuit 608

Figure 11:
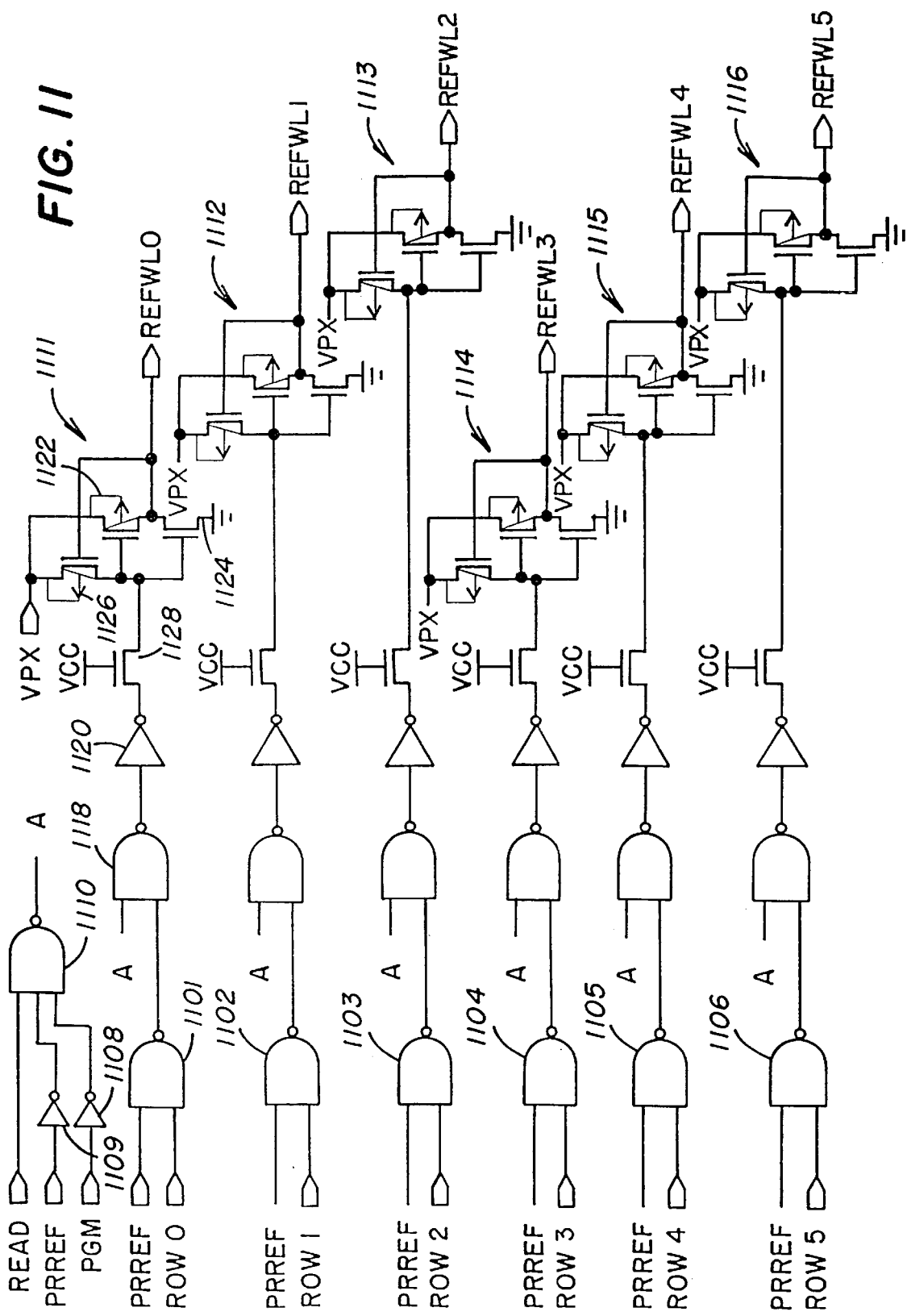
FIG. 11 shows circuitry for the sense bias circuit shown in FIG. 6.

FIG. 11 shows circuitry for the sense bias circuit 608 shown in FIG. 6. The circuitry of FIG. 11 receives the PRREF signal when the program reference mode is entered and the ROW0–ROW5 signals output from the reference count circuit 604 shown in FIG. 6. The PRREF signal is connected along with each of the ROW0–ROW5 signals to inputs of respective NAND gates 1101–1106 to enable one of buffers 1111–1116 when the PRREF signal and a respective ROW0–ROW5 input is enabled. Buffers 1111–1116 alternately receive the program and verify voltages over VPX from the program-verify signal circuit 602 of FIG. 6 and couple VPX to a respective reference cell word line (REFWL0–REFWL5) when its respective buffer is enabled. A word line not selected is typically grounded.

The circuitry of FIG. 11 further receives a READ signal when a read or verify mode is entered to determine a state of an array cell. The PGM signal is also received through inverter 1108 indicating that the VPX signal is not being applied to program or erase an array cell. The PRREF signal is further received through inverter 1109 to indicate that verify of a reference cell is not occurring. The READ signal and the outputs of inverters 1108 and 1109 are applied to the input of NAND gate 1110. During read of an array cell, buffers 1111–1116 receive a read or verify voltage over VPX and provide the VPX signal to all the reference cell word lines (REFWL0–REFWL5).

Buffers 1111–1116 have identical circuitry, so only the circuitry of buffer 1111 will be described. Buffer 1111 receives a select input signal from the output of NAND gates 1101 and 1110 at the inputs of NAND gate 1118. The output of NAND gate 1118 is provided through inverter 1120 to the input of an inverter formed by transistors 1122 and 1124.

The output of inverter 1122,1124 provides the REFWL0 signal. Pull up transistor 1122 couples the VPX signal to the REFWL0 output when the output inverter 1120 is low. Pull down transistor 1124 couples the REFWL0 output to ground when the output of inverter 1120 is high. A transistor 1126 has a current path connected between VPX and the input of inverter 1122,1124 and has a gate connected to the REFWL0 output to assure transistor 1122 is off when buffer 1111 is deselected. Since VPX has a value significantly higher than $V_{CC}$ during program, to prevent feedback, an n-channel transistor 1128 is connected between the input of inverter 1122,1124 and the output of inverter 1120 and has a gate connected to $V_{CC}$.

Reference Bias Circuit 610

Figure 12:
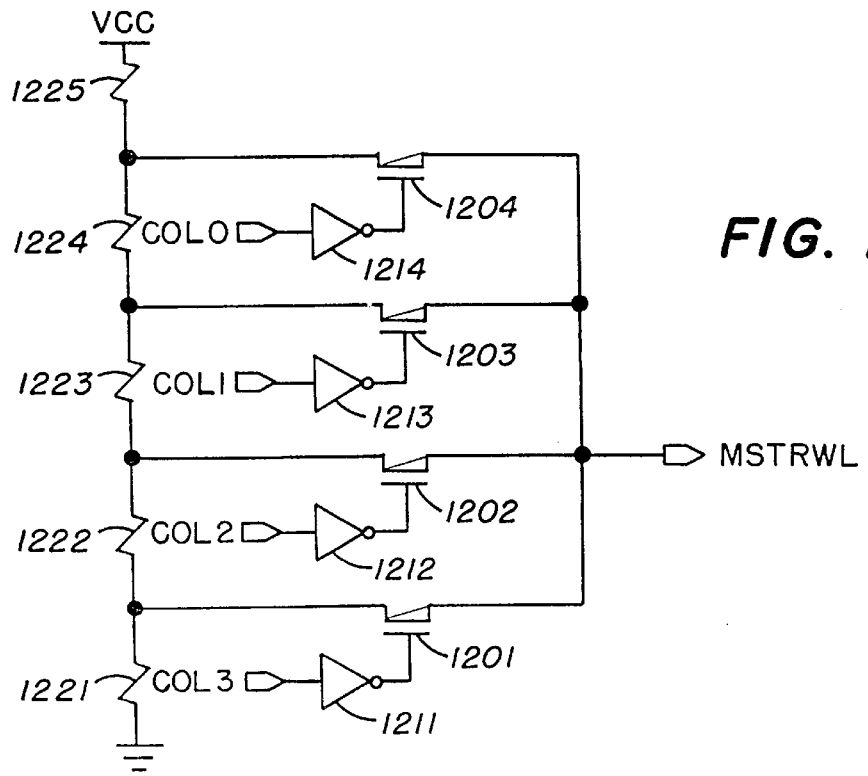
FIG. 12 shows circuitry for the reference bias circuit shown in FIG. 6.

FIG. 12 shows circuitry for the reference bias circuit 610 shown in FIG. 6. The circuitry of FIG. 12 receives COL0–COL3 signals output from the reference count circuit 604 shown in FIG. 6. The COL0–COL3 signals are connected to the gates of p-channel transistors 1201–1204 through inverters 1211–1214 to couple a resistor ratio to the gate of the golden reference MSTRWL as selected by the COL0–COL3 signals. The resistor ratios are formed by coupling the current paths of transistors 1201–1204 respectively between successive ones of resistors 1221–1225 and MSTRWL.

As discussed previously, the circuitry of FIG. 12 enables the reference cells to be verified as properly programmed utilizing the bias gate method. The bias gate method couples a resistor ratio to the gate of the golden reference and compares the golden reference output with an output of a reference cell being programmed to determine if the floating gate of the reference cell is charged to a proper threshold level. This method utilizes the fact that the golden bit will be saturated according to the MOS transistor saturation equation $I_D = K (V_{GS} - V_t)^2$, so that reducing the gate voltage $V_{GS}$ by a fixed amount using a resister ratio will provide the same current as a reference cell that has been programmed to a desired threshold value $V_t$.

For example, utilizing the bias gate method, if a 0.55 V differential between thresholds is required to stay between a maximum range of programmable threshold voltages of 4.0 V to 1.8 V, four reference thresholds will be programmed with a 3/2 density array, as shown in FIG. 2, at 3.45 V, 2.90 V, 2.35 V and 1.80 V. To program a first reference to a level of 3.45 V, a resistor ratio is chosen to bias the gate of the golden reference at $V_{CC}$–0.55 V. Different resistor ratios are subsequently selected to bias the gate of the golden reference to program the remaining reference cells. Note, as discussed previously, because with the bias gate method, as $V_{CC}$ is varied, the thresholds programmed will vary with respect to each other, programming is preferably done at test time by the manufacturer to maintain Vcc within tight tolerances. Similarly, to assure the thresholds remain constant with respect to one another, the manufacturer preferably controls temperature within tight tolerances.

Reference Sense Circuit 612

Figure 13:
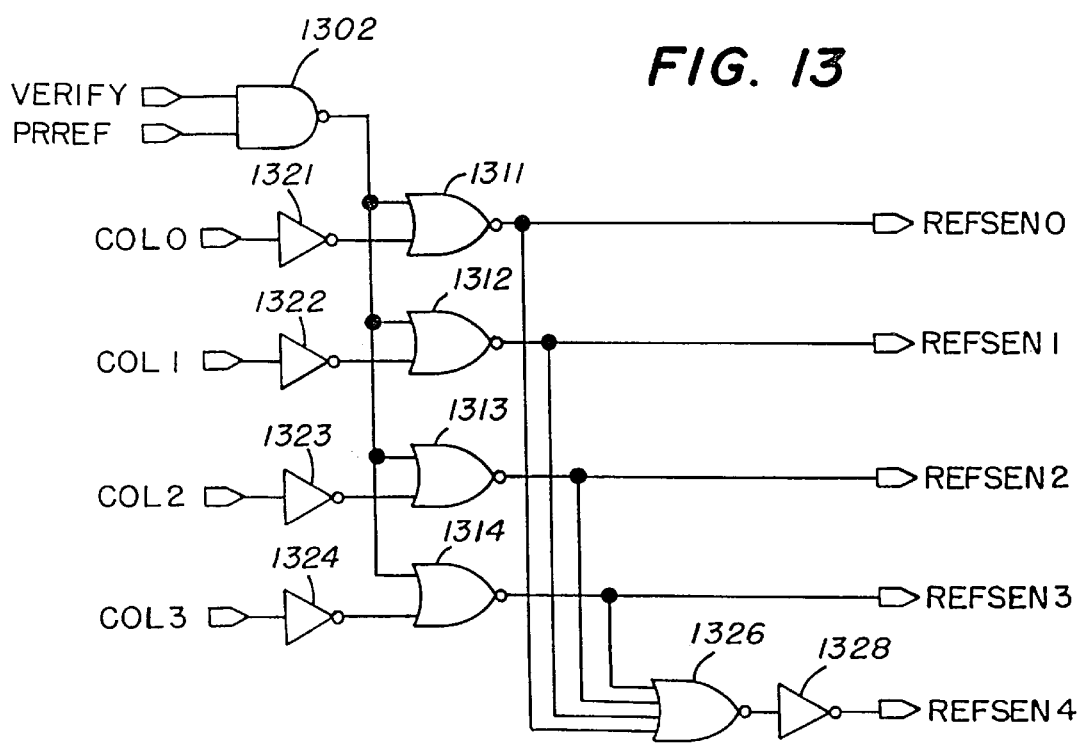
FIG. 13 shows circuitry for the reference sense circuit shown in FIG. 6.

FIG. 13 shows circuitry for the reference sense circuit 612 shown in FIG. 6. The circuitry of FIG. 13 provides an enable signal (REFSEN0–REFSEN4) to enable cascode preamplifiers of circuitry 614 and a sense amplifier of circuitry 616 to verify if the currently selected reference is properly programmed. The REFSEN0–REFSEN4 signal is provided when VERIFY is asserted and the PRREF signal is received. To conserve power, the column signal (COL0–COL3) from reference count circuit 604 is utilized to select only the necessary REFSEN0–REFSEN4 outputs to enable the cascode preamplifiers and sense amplifiers necessary to verify if the selected reference cell is properly programmed.

The circuitry of FIG. 13 receives the VERIFY and PRREF signals at the inputs of NAND gate 1302. The output of NAND gate 1302 is connected to the inputs of NOR gates 1311–1314 along with respective ones of COL0–COL3 signals as provided through inverters 1321–1324. The outputs of NOR gates 1311–1314 provide the REFSEN0–REFSEN3 output signals. The outputs of NOR gates 1311–1314 are further ORed by NOR gate 1326 and inverter 1328 to provide a REFSEN4 signal which is provided to enable the cascode preamplifier connected to the golden reference when one of the REFSEN0–REFSEN3 signals are enabled.

Cascode Preamplifiers 614

Figure 14:
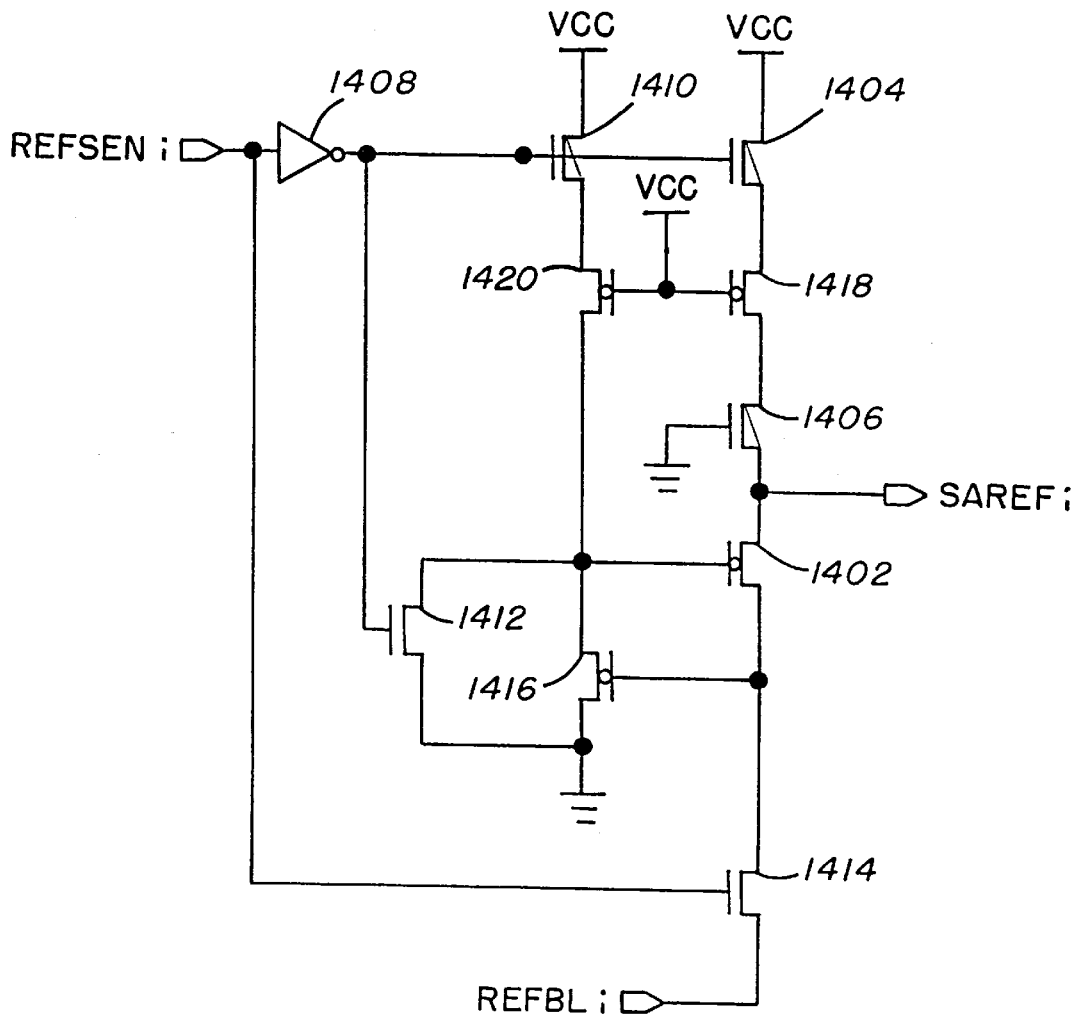
FIG. 14 shows circuitry for one of the cascode preamplifiers utilized in the circuitry of FIG. 6.

FIG. 14 shows circuitry for one of the cascode preamplifiers utilized in the cascode preamplifiers 614 shown in FIG. 6. The cascode preamplifiers 614 of FIG. 6 include five of the cascode preamplifiers as shown in FIG. 14. Four cascode preamplifier circuit are provided to receive each bit line output REFBL0–REFBL3 and an additional cascode preamplifier receives the GOLBL output. The cascode preamplifiers convert a current from the bit line received to an output voltage SAREF1–SAREF4 during the verify process. Each cascode preamplifier receives a respective enable signal REFSEN0–REFSEN4 from reference sense circuit 612 to enable the verify process as described previously.

As shown, the circuit of FIG. 14 receives a REFBLi signal representative of a particular bit line signal (REFBL0–REFBL3 or GOLBL) and a REFSENi signal representative of a REFSEN0–REFSEN4 enabling signal. The output, SAREFi, is representative of the particular SAREF0–SAREF4 signal output. The cascode amplifier is provided in the circuit of FIG. 14 by a cascade transistor 1402 having a drain connected to the SAREFi output.

The preamplifier is enabled by the complement of REFSENi provided through an inverter 1408 to the gate of an enabling transistor 1404. The enabling transistor 1404 is connected in series with an n-channel level shifting transistor 1418 and a p-channel load transistor 1406 between $V_{CC}$ and the SAREFi output. To provide bias for cascode 1402, the complement of REFSENi is further provided through inverter 1408 to the gate of a switching transistor 1410. Transistor 1410 is connected in series with a feedback load transistor 1420 between $V_{CC}$ and the gate of cascade 1402. To disable the preamplifier, an n-channel switching transistor 1412 is provided with a gate connected to the output of inverter 1408 to couple the gate of cascade 1402 to ground when the complement of REFSENi is not provided.

The REFBLi signal is provided through a transistor 1414 to the source of cascode 1402 to be amplified at the SAREFi output. The gate of transistor 1414 is enabled by REFSENi when the preamplifier is enabled. Further biasing for cascode 1402 is provided by feedback from the source of cascode 1402 by transistor 1416. Transistor 1416 has a gate connected to the source of transistor 1402, a drain connected to the gate of transistor 1402 and a source connected to ground.

Sense Amplifiers 616

Figure 15:
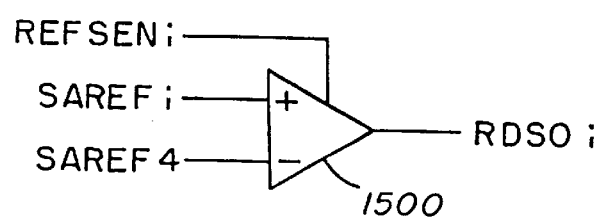
FIG. 15 shows circuitry for one of the sense amplifiers utilized in the circuitry of FIG. 6.

FIG. 15 shows circuitry for one of the sense amplifiers utilized in the sense amplifiers 616 shown in FIG. 6. Sense amplifier circuits 616 of FIG. 6 includes four of the sense amplifiers as shown in FIG. 15. The four sense amplifiers are provided to compare an enabled reference cell output voltage (SAREF0–SAREF3) to the golden reference output voltage (SAREF4). The sense amplifier output signals (RDSO0–RESO3) indicate if a cell being programmed is fully programmed.

As shown, the circuit of FIG. 15 receives a SAREFi signal representative of a particular cascade preamplifier output (SAREF0–SAREF3) from a selected reference cell and a SAREF4 signal from the cascode preamplifier connected to the golden reference. The circuit of FIG. 15 further receives a REFSENi signal representative of a REFSEN0–REFSEN3 enabling signal and outputs a RDSOi signal representative of the particular RDSO1–RDSO3 output.

The sense amplifier of FIG. 15 is a differential amplifier 1500 which is enabled by the REFSENi signal. The sense amplifier compares the SAREFi and SAREFGB signals and outputs the RDSOi signal when the value of SAREFi exceeds SAREF4.

Although the invention has been described above with particularity, this was merely to teach one of ordinary skill in the art how to make and use the invention. Many modifications will fall within the scope of the invention, as that scope is defined by the following claims.

What is claimed is:

1. A memory comprising:

an array cell having an output, an array threshold value set to one of n array threshold values to control a signal provided at the array cell output, and a gate;

a reference cell having an output, a floating gate which stores an electrical charge to allow a reference threshold value to be programmed, and a gate, the reference cell having its reference threshold value programmed between two successive ones of the n array threshold values to control a signal provided at the reference cell output;

a comparison circuit coupled to the array cell output and the reference cell output, the comparison circuit for comparing the signal at the array cell output to the signal at the reference cell output and providing a signal indicating which of the n array threshold values is held by the array cell; and a power supply for supplying a supply voltage to the gate of the array cell to enable the array cell to provide the signal at the array cell output, the power supply further supplying the supply voltage to the gate of the programmable reference cell to enable the reference cell to provide the signal at the reference cell output.

2. The memory of claim 1 wherein when a value of the supply voltage is varied, a working margin between the array cell output and the reference cell output remains constant.

3. The memory of claim 1 wherein n is greater than two.

4. A memory comprising:

an array cell having a gate and a floating gate which stores an electrical charge to allow an array threshold value to be programmed;

n program reference cells, each program reference cell having a gate and a floating gate which stores an electrical charge to allow a program reference threshold value to be programmed;

n−1 read reference cells, each read reference cell having a gate and a floating gate which stores an electrical charge to allow a read reference threshold value to be programmed;

a reference program-verify means for alternately applying program and reference verify voltages to the gates of the n program reference cells to program the n program reference cells to different n program reference threshold values and for alternately applying the program and reference verify voltages to the gates of the n−1 read reference cells to program the read reference threshold value for each successive read reference cell between two successive ones of the program reference threshold values;

an array program-verify means for alternately applying program and array verify voltages to the gate of the array cell until the array threshold value is programmed to be equal to the program reference threshold value of a given one of the n program reference cells;

a power supply for supplying a read voltage to the gate of the array cell and the gates of the read reference cells to obtain an array cell output and a read reference cell output from each of the read reference cells; and a comparison circuit coupled to receive the array cell output and the read reference cell outputs, the comparison circuit providing a signal indicating the given one of the n program reference cells used to program the array cell.

5. The memory of claim 4 wherein the reference verify voltage has a value which varies significantly less than the array verify voltage.

6. The memory of claim 4 wherein when the read or verify voltage is applied, the read reference cells, the reference cells and the array cell are biased substantially the same.

7. The memory of claim 4 wherein the program reference cells, the read reference cells and the array cell are included as core cells on a single integrated circuit so that the program reference cells, the read reference cells and the array cell have substantially the same rate of thermal expansion.

8. The memory of claim 4 wherein when a value of the read voltage is varied a working margin between outputs of the program reference cells, the read reference cell outputs and the array cell output remains constant.

9. The memory of claim 4 wherein n is greater than two.

10. An apparatus for programming a plurality of reference cells used to read a threshold voltage of an array cell, each reference cell in the plurality of reference cells having a gate and a drain, the apparatus comprising:

a reference count circuit for sequentially selecting a particular reference cell in the plurality of reference cells, the reference count circuit indicating the particular reference cell being selected by outputting a column (COL) signal and a ROW signal and sequencing to a next sequential reference cell when an updated read sense amp output signal (RDSO) signal is received;

a program-verify signal circuit for supplying a program-verify voltage for applying to the gate of the particular reference cell to alternately program the particular reference cell and verify if the particular reference cell is fully programmed, and for supplying a program voltage for applying to the drain of the particular reference cell during programming, and for supplying a verify signal during verification;

a sense bias circuit for receiving the ROW signal and the program-verify voltage and coupling the program-verify voltage to the gate of the particular reference cell as controlled by the ROW signal;

a data buffer reference circuit for receiving the COL signal and the program voltage and coupling the program voltage to the drain of the particular reference cell as controlled by the COL signal;

a golden bit cell having a gate and a drain;

a reference bias circuit having a plurality of resistance ratios, each resistance ratio being coupled between a read voltage and the gate of the golden bit cell as controlled by the COL signal; and a comparison circuit for receiving the verify signal and being connected to the drain of the golden bit cell and the drain of the particular reference cell, the comparison circuit comparing the signal from the drain of the golden bit cell to the signal from the drain of the particular reference cell during application of the verify signal and outputting the RDSO signal when the signals are substantially equal.

11. The apparatus of claim 10 wherein the plurality of reference cells are also utilized to program a threshold voltage of an array cell.

12. The apparatus of claim 10, wherein the comparison circuit comprises:

a reference sense circuit for receiving the verify signal and outputting a reference sense circuit signal (REFSEN) when the verify signal is applied;

a first preamplifier receiving the REFSEN signal, and the signal from the drain of the particular reference cell and outputting a first sense amplifier voltage voltage indicative of the signal from the drain of the particular cell when the REFSEN signal is applied;

a second preamplifier receiving the REFSEN signal, and the signal from the drain of the golden bit cell and outputting a second sense amplifier voltage voltage indicative of the signal from the gate of the golden bit cell when the REFSEN signal is applied;

a sense amplifier receiving the first and second sense amplifier voltages and outputting the RDSO signal when the first and second sense amplifier voltages are substantially equal.

13. A method of programming n reference cells comprising the successive steps of:

(a) selecting a first of the n reference cells as a selected reference cell and a first of n resistor ratios as a selected resistor ratio;

(b) coupling the selected resistor ratio to a gate of a golden bit cell;

(c) applying a program voltage to increase charge stored on a floating gate of the selected reference cell;

(d) applying a reference verify voltage to the gate of the selected reference cell and through the selected resistor ratio to the gate of the golden bit to create a selected reference cell output and a golden bit cell output;

(e) comparing the selected reference cell output and the golden bit cell output and proceeding to step (c) if the selected reference cell output is not substantially equal to the golden bit cell output;

(f) selecting a next successive reference cell in the n reference cells as the selected reference cell and a next successive resistor ratio in the n resistor ratios as the selected resistor ratio and proceeding to step (b) if the $n^{th}$ reference cell in the n reference cells has not been previously selected.

14. A memory comprising:

a first word line;

a second word line;

a power supply for providing a substantially identical supply voltage to the first word line and the second word line;

an array cell having a gate connected to the first word line and a source-to-drain path, the array cell having a threshold value set to one of n array threshold values;

n−1 read reference cells, each read reference cell having a gate connected to the second word line, a source-to-drain path and a floating gate which stores an electrical charge to allow a reference threshold value to be programmed, each respective read reference cell having its reference threshold value programmed between two different successive ones of the n array threshold values; and read sense amplifiers, each read sense amplifier having a first input coupled to the source-to-drain path of the array cell and a second input coupled to the source-to-drain path of a respective one of the read reference cells, each read sense amplifier for providing an output signal indicating whether a signal received at its first input is greater than a signal received at its second input.

15. The memory of claim 14 further comprising:

n verify reference cells, each verify reference cell having a gate connected to the second word line, a source-to-drain path and a floating gate which stores an electrical charge to allow a reference threshold value to be programmed, each respective verify reference cell having its reference threshold value programmed to a different one of n array threshold values; and verify sense amplifiers, each verify sense amplifier having a first input coupled to the source-to-drain path of the array cell and a second input coupled to the source-to-drain path of a respective one of the verify reference cells, each verify sense amplifier for providing an output signal indicating whether a signal received at its first input is greater than a signal received at its second input.

16. The memory of claim 14 wherein n is greater than two.

\* \* \* \* \*

UNITED STATES PATENT AND TRADEMARK OFFICE
CERTIFICATE OF CORRECTION

PATENT NO. : 5,828,601
DATED : October 27, 1998
INVENTOR(S) : Hollmer et al.

It is certified that error appears in the above-identified patent and that said Letters Patent is hereby corrected as shown below:

Column 13, line 19, before the second occurrence of "reference", insert --program--.

Column 14, line 15, delete the word "voltage" to avoid having it repeated twice in a row.

Column 14, line 20, delete the word "voltage" to avoid having it repeated twice in a row.

Signed and Sealed this

Fifteenth Day of May, 2001

Attest:

NICHOLAS P. GODICI

Attesting Officer

Acting Director of the United States Patent and Trademark Office